United States Patent [19]
Dirks

[11] Patent Number: 4,975,671
[45] Date of Patent: Dec. 4, 1990

[54] TRANSFORMER FOR USE WITH SURFACE MOUNTING TECHNOLOGY

[75] Inventor: Wolfgang Dirks, Monte Sereno, Calif.

[73] Assignee: Apple Computer, Inc., Cupertino, Calif.

[21] Appl. No.: 461,191

[22] Filed: Mar. 7, 1990

Related U.S. Application Data

[63] Continuation of Ser. No. 238,780, Aug. 31, 1988, abandoned.

[51] Int. Cl.⁵ ...................... H01F 15/02; H01F 27/28
[52] U.S. Cl. .................................... 336/65; 336/200; 336/223; 336/229
[58] Field of Search ................. 336/65, 200, 223, 225, 336/229, 90, 92, 96

[56] References Cited

U.S. PATENT DOCUMENTS

| | | | |
|---|---|---|---|
| 1,801,214 | 4/1931 | Von Henke | 336/223 |
| 4,103,267 | 7/1978 | Olschewski | 336/200 X |
| 4,249,229 | 2/1981 | Hester | 336/65 X |
| 4,777,465 | 10/1988 | Meinel | 336/223 X |

FOREIGN PATENT DOCUMENTS

| | | | |
|---|---|---|---|
| 3434497 | 3/1986 | Fed. Rep. of Germany | 336/200 |
| 4429688 | 12/1966 | Japan | 336/200 |
| 55-128805 | 10/1980 | Japan | 336/229 |

OTHER PUBLICATIONS

IBM Technical Disclosure Bulletin, vol. 17, No. 7, Dec. 1974, "Hybrid Toroidal Transformer Winding," A. Werner, pp. 1993, 336-223.

*Primary Examiner*—Thomas J. Kozma
*Attorney, Agent, or Firm*—Blakely, Sokoloff, Taylor & Zafman

[57] ABSTRACT

A multi-component transformer to be used in conjunction with surface mounting technology. Transformer windings are provided by a plurality of conductors arranged in parallel and disposed around a ferrite core. A portion of the winding is disposed in a spacer member or alternatively is formed from tracings of a circuit board. A portion of a ferrite core is disposed above the conductors. Then a bridge member, which is U-shaped and has a plurality of conductors disposed in a dielectric body, is disposed to overlie a portion of the magnetic core overlying the first tracings. The conductors of the bridge member are coupled to the underlying tracings such that the tracings form a continuous loop around a portion of the magnetic core to function as a winding of a transformer. Alternative embodiments are disclosed in which variations of the multi-component provides variations in the design.

7 Claims, 9 Drawing Sheets

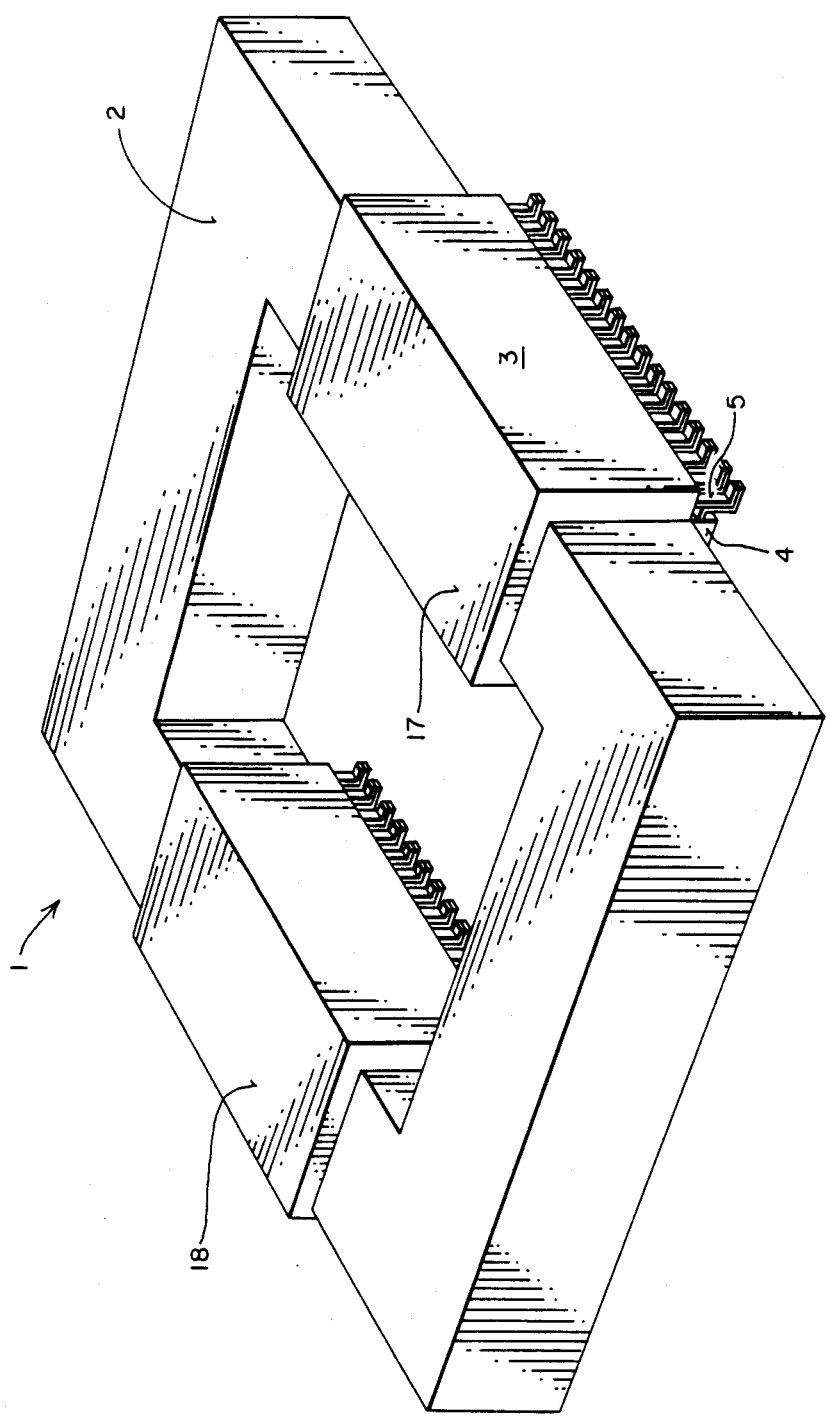
FIG—1

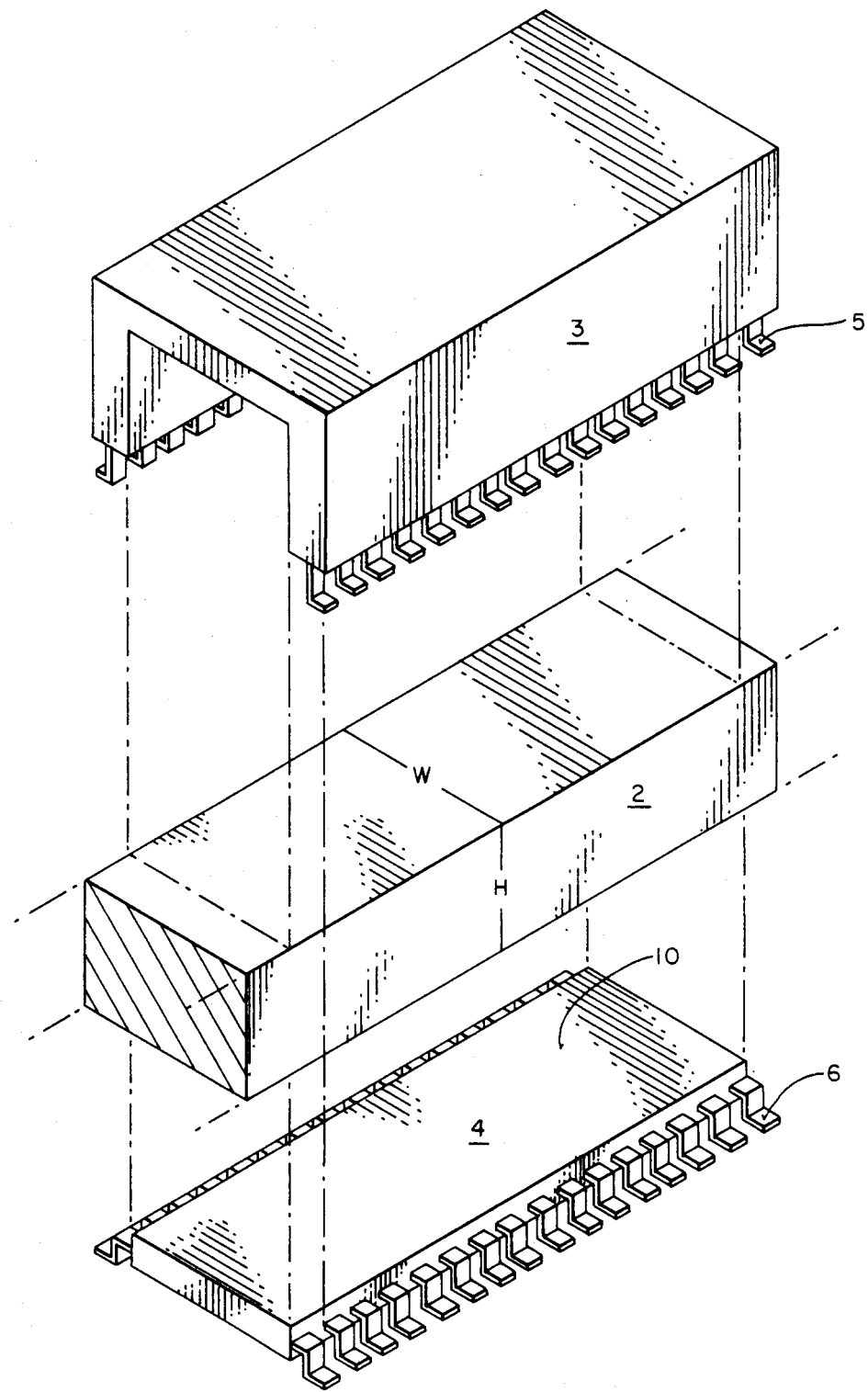

FIG_3
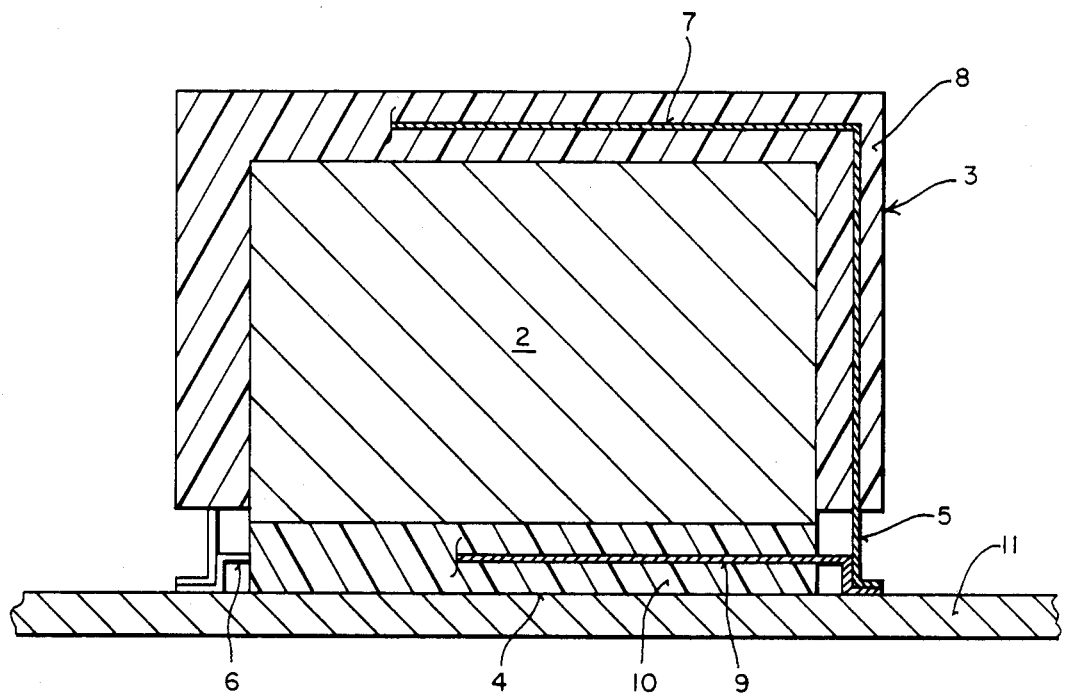
FIG_6
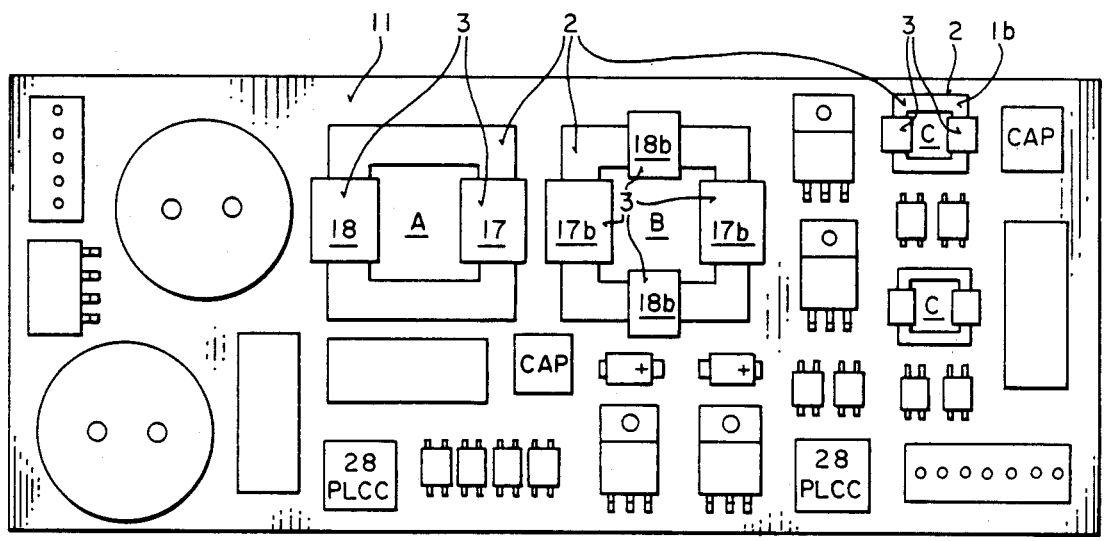

FIG_4
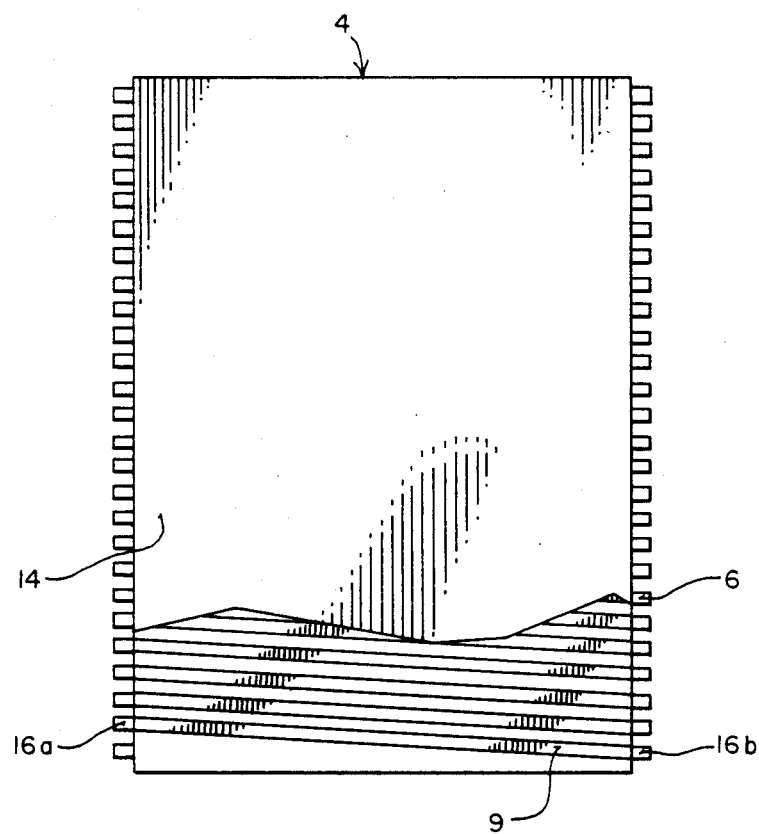
FIG_5
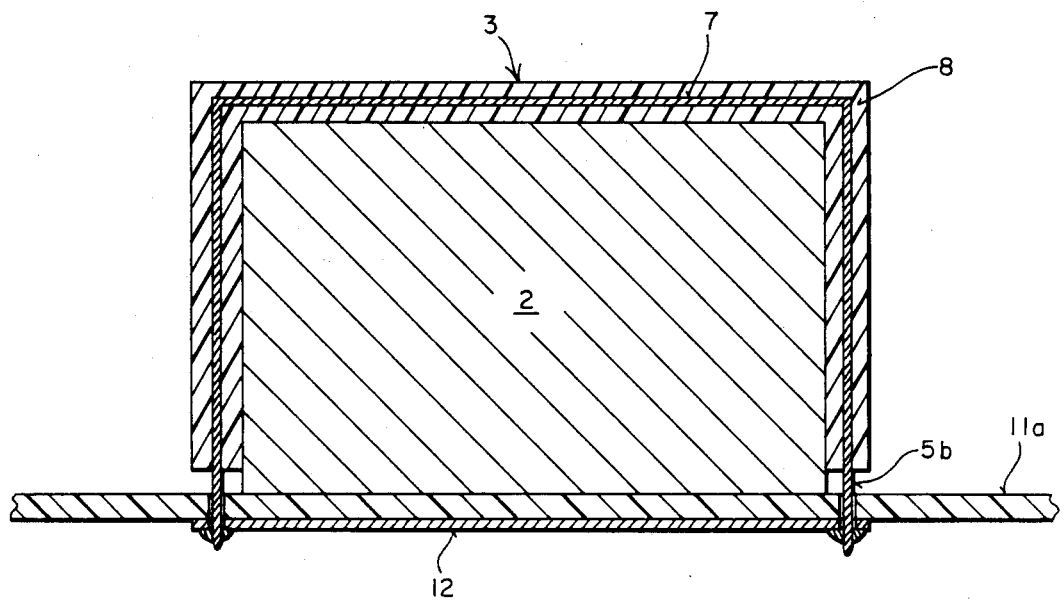

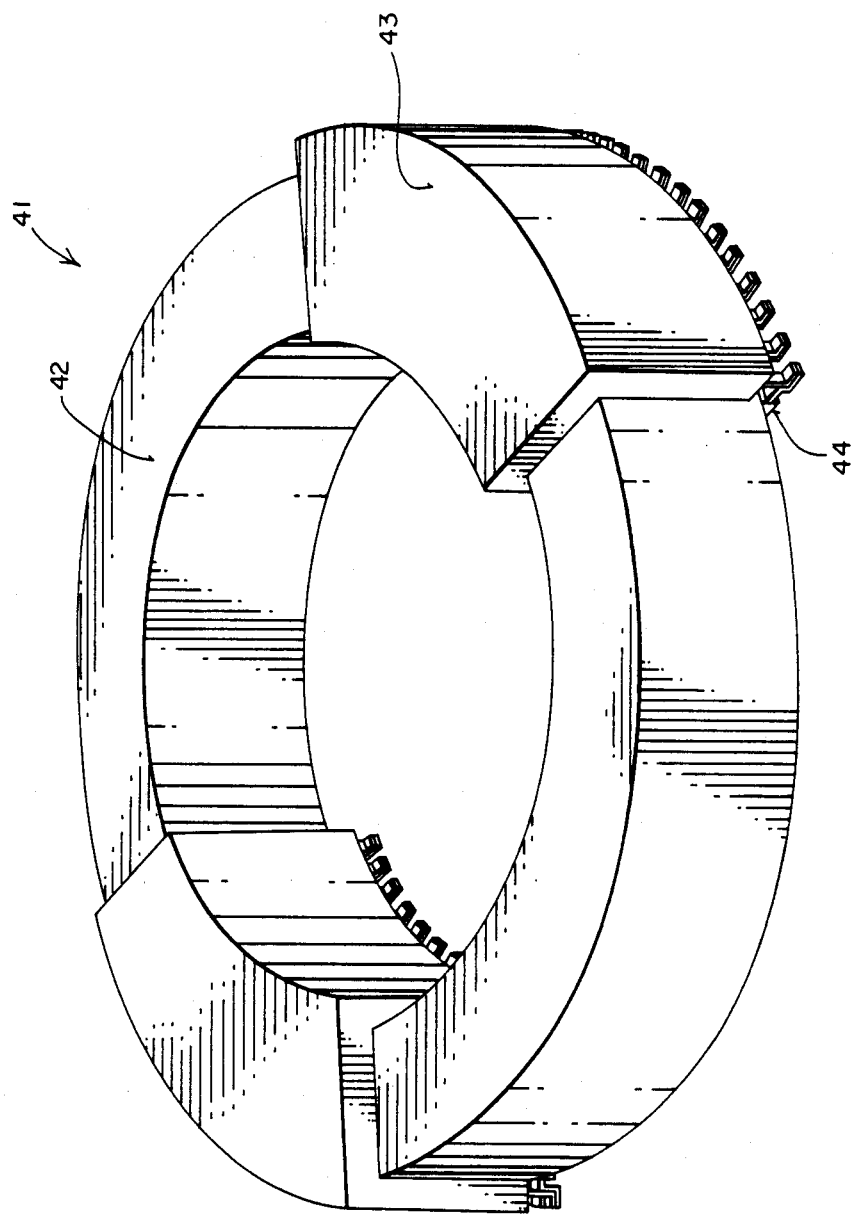
FIG — 7

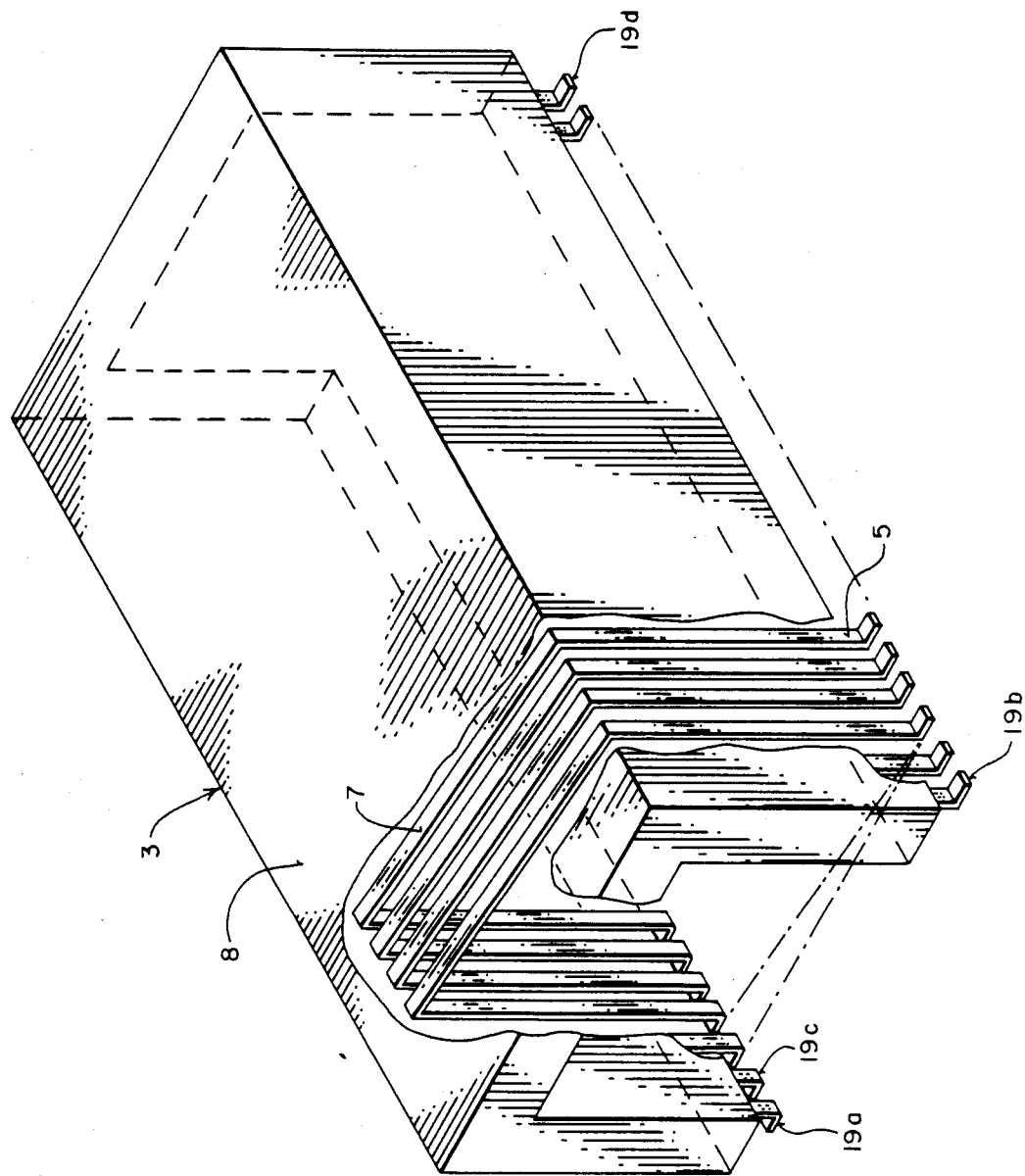
FIG — 11

FIG _ 9
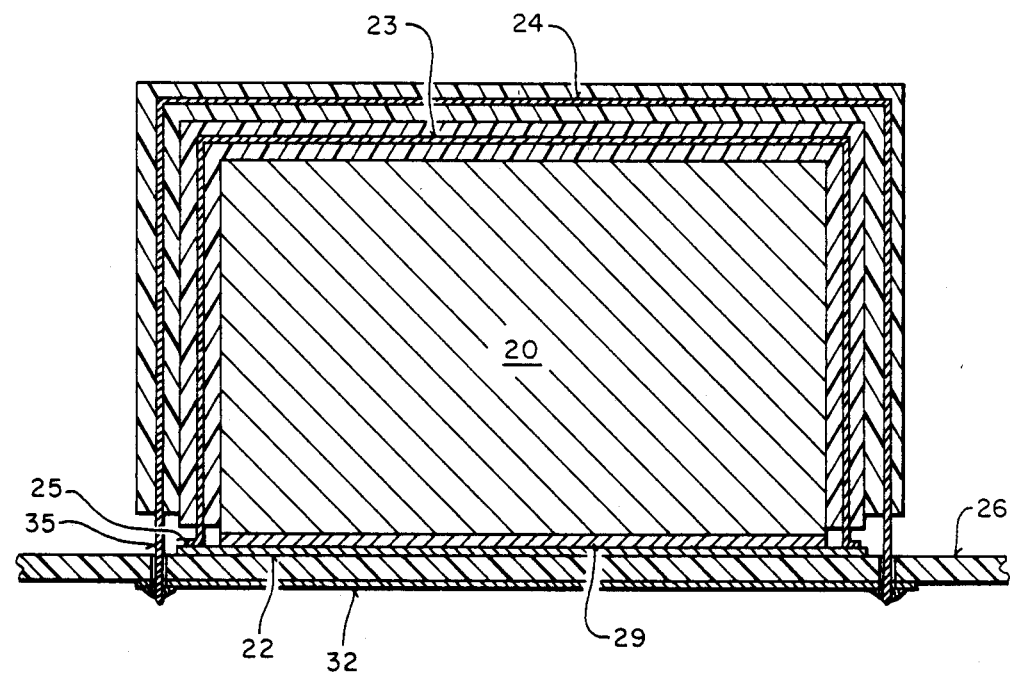
FIG _ 10
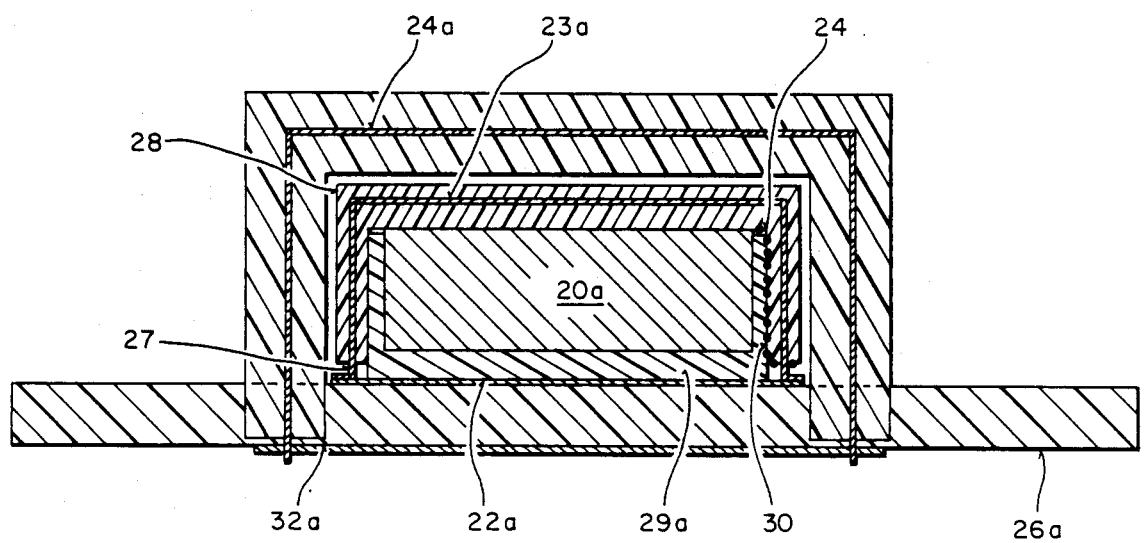

FIG_11
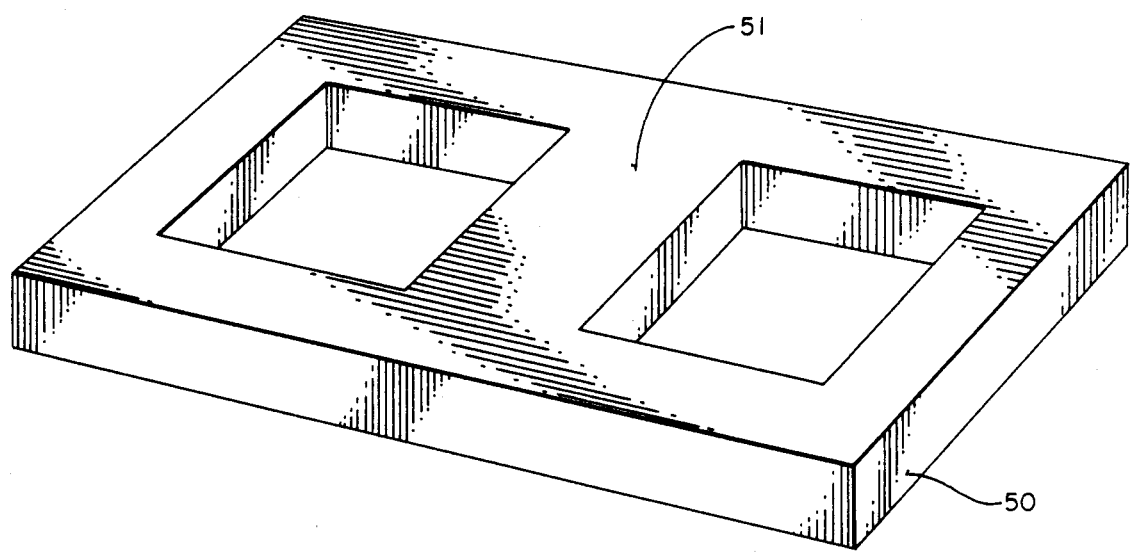
FIG_12
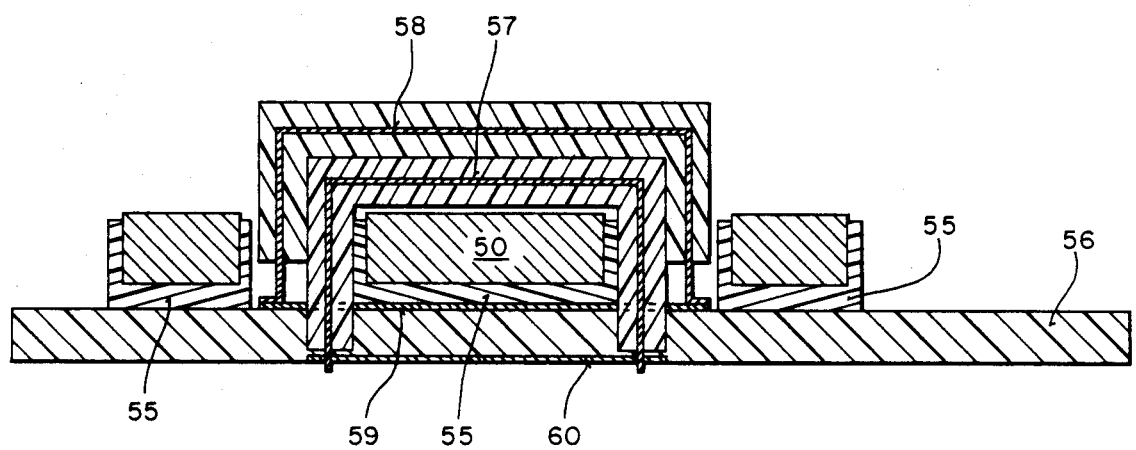

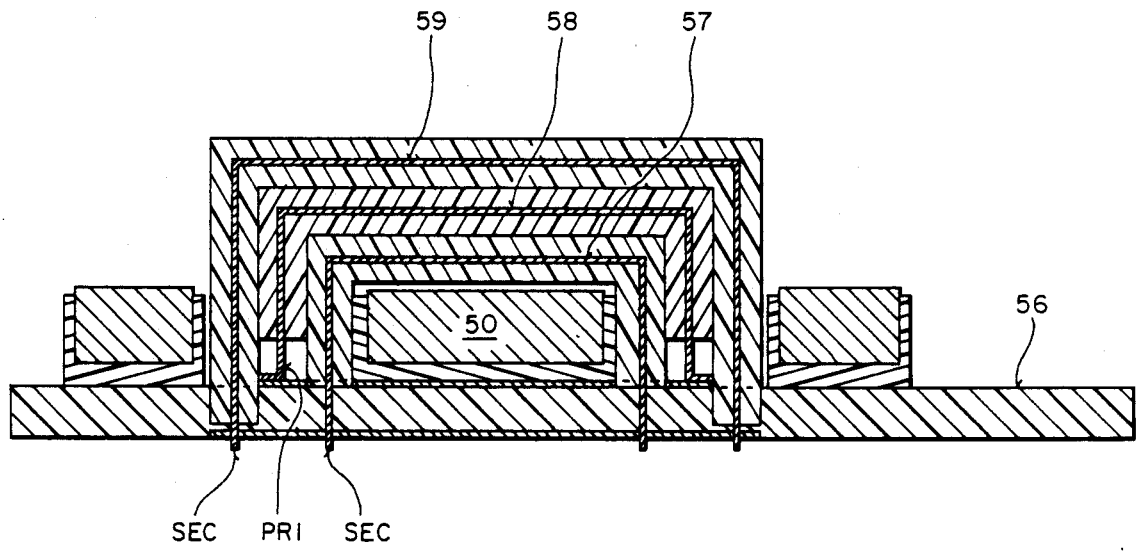
FIG_13

TRANSFORMER FOR USE WITH SURFACE MOUNTING TECHNOLOGY

This application is a continuation, of application Ser. No. 238,780, filed Aug. 31, 1988 now abandoned.

BACKGROUND OF THE INVENTION

1. Field of the Invention

This invention relates to the field of electrical transformers. More particularly, to a transformer designed to be used in conjunction with surface mounting technology for assembly onto a printed circuit board or the like.

2. Prior Art

Various designs, configurations and structures for electrical transformers are well-known in the prior art. A basic transformer is comprised of at least two closely coupled coils which form a primary and a secondary winding, respectively. The primary and secondary windings are physically disposed in such a way so that energy transfer is achieved by the movement of the electromagnetic flux lines, originating from the primary winding, move across the secondary winding, wherein energy transfer to the secondary winding is achieved. Although there are variations to this basic design, the general concept of energy transfer in a transformer is achieved by the movement of the electromagnetical flux lines across the secondary winding. In some instances, such as for a low frequency operation, the windings are wrapped about a ferrite core. In most instances, the windings are typically formed from copper or plated copper wire.

In manufacturing a typical prior art transformer, the wires are machine or hand wrapped to form the various windings. The windings are wrapped about a ferrite or an air core. Then the whole unit is molded or laminated and sometimes encased in a metal housing with the terminals of the windings being located outside of the casing. Power transformers, which are used in a power supply, are typically designed to be mounted by fasteners, such as screws and bolts, because of their size and weight. Once these prior art transformers are physically mounted onto a circuit board or chassis, then hand soldering of electrical connections to the various terminals of the transformer are required. The manual soldering operation is not only time consuming but costly due to the use of manual labor. Even with the use of automated machinery, the prior art transformers still require a special soldering step, typically performed as a manual operation, for connecting the electrical wires to the various transformer terminals.

One segment of the automated printed circuit (PC) board assembly entails the practice of surface mount technology (SMT). In a typical SMT operation, an unassembled PC board enters the assembly station of a production line during a manufacturing process. The PC board is positioned proximal to an automated assembly tool, such as an automated robotic mechanism. In a typical automated assembly process, a tray of components, which components are to be assembled onto the PC board, are also disposed near by. The automated equipment selects a given component and positions the component to the appropriate location on the PC board. With SMT, the leads of the component are disposed through appropriate openings on the PC board, or in other instances placed onto the surface of the PC board without penetrating through the PC board, and are physically affixed and electrically coupled to the PC board, such as by soldering or welding. A robot mechanism uses a variety of sensing devices, including weight sensors and optical scanners to identify and align the various components for placement onto the PC board. These techniques of surface mounting various components onto a PC board by the use of automated equipment is well-known in the prior art.

However, the robotic mechanisms are designed to operate with relatively small size and light weight components, such as resistors, capacitors, and semiconductor chips. Larger and heavier components, such as conventional transformers cannot be readily adapted for SMT. Of course larger robotics mechanisms can be used, however, because of the prohibitive cost of larger robotics arms, for example, it is typically economically unsound to utilize significantly larger robotics mechanism just to be able to automatically mount transformers onto the PC board. In some instances, where the robotics mechanism is capable of lifting and placing a transformer onto the PC board, the terminals of the transformer do not lend themselves to the surface of the PC board for surface mounting. As a result, conventional transformers suffer from the disadvantage of needing the less efficient manual placement onto the PC board and the subsequent manual soldering of the electrical connections. Without the use of highly specialized robotics mechanisms, especially adapted for mounting such transformers, prior art transformers cannot be readily used for surface mounting onto a PC board.

Additionally, the current prior art transformer designs, especially the power transformers, are less efficient. Also, heat dissipation is a concern on a closely populated PC board. One method to increase heat dissipation is to increase the exposure of a greater area of the tranformer core. However, a configuration that advantageously leaves the windings exposed, increases the likelihood of stray inductance. On the other hand, surrounding both the transformer windings and the core increases the weight and the size thereby increasing space displacement on the PC board. Moreover, beyond the problems of weight, size, heat dissipation, and structure for use with SMT, the windings may not be precise as to their placement and separation. That is, because the windings are comprised of coils wound on top of each other, the placement and separation of the windings is difficult to precisely achieve with typical prior art transformer manufacturing methods.

It is appreciated that what is needed is a heat efficient, relatively small size, light weight and cost effective transformer that can be used with surface mount technology. The present invention describes a surface mount transformer which can be used with automated assembly equipment and which is cost effective.

SUMMARY OF THE PRESENT INVENTION

The present invention is realized in a specific illustrative embodiment thereof in which a configuration for a power transformer comprises a ferrite core, a molded coil bridge with a plurality of angular leads extending, and a molded spacer and coil cross over with a plurality of angular leads extending which are electrically coupled to the angular leads of the molded coil bridge and etched tracings of a PC board. Moreover, the bridge members are designed to permit precise placement and separation of windings. Advantageously, the windings are separated by a dielectric material and coupled to the angular leads that are designed in a manner similar to a conventional dual-in-line package (DIP). In this manner, board mounting efficiency is substantially increased.

By means of the coupling of the bridge and cross over spacer leads to the PC board, current is introduced into the windings. To maximize coupling efficiency, the surface mount transformer is designed to parameters which can be tightly controlled and to provide precise use of leakage inductance. As a result of the configuration, the windings are advantageously contained, while allowing the ferrite core exposure. By means of this exposure, heat dissipation from the surface transformer is efficiently maximized.

Various alternative embodiments of the present invention are provided to exemplify the flexibility of the design and use of the transformer of the present invention. For example, PC board tracings are used as part of the winding; windings are disposed to overlie other windings; variations in the shape of the core; and use of the transformer for high voltage applications.

BRIEF DESCRIPTION OF THE DRAWINGS

FIG. 1 is a perspective view of an assembled transformer made in accordance with the principals of the present invention.

FIG. 2 is an exploded view of a segment of the rectangular transformer of FIG. 1.

FIG. 3 is a cross sectional representation of the rectangular transformer of FIG. 1.

FIG. 4 is a partially exposed top view of a molded spacer element included in FIG. 1, depicting the windings in the dielectric molding.

FIG. 5 is cross sectional representation of an alternative embodiment of the rectangular transformer of FIG. 1, but using tracings of a PC board instead of a spacer element.

FIG. 6 is a top view of a printed circuit board assembly as an example showing the placement of several transformers of the present invention.

FIG. 7 is a perspective view of an alternative embodiment of an assembled toroidal transformer made in accordance with the principals of the present invention.

FIG. 8 is a partially exposed perspective view of the molded bridge included in FIG. 1, depicting the windings in the dielectric molding.

FIG. 9 is an alternative embodiment showing cross-sectional representation of a concentric mounting arrangement of windings in a rectangular transformer.

FIG. 10 is another alternative embodiment of a transformer of the present invention which is designed for high-voltage applications.

FIG. 11 is an alternative embodiment of a core having a rectangular shape but with a center member disposed.

FIG. 12 is another alternative embodiment of a transformer having two concentric windings and using the core of FIG. 11.

FIG. 13 is another alternative embodiment of a transformer having three concentric windings and using the core of FIG. 11.

DETAILED DESCRIPTION OF THE PRESENT INVENTION

A transformer for use with surface mount technology is described. In the following description, numerous specific details are set forth in order to provide a thorough understanding of the present invention. It will be obvious, however, to one skilled in the art that the present invention may be practiced without these specific details. In other instances, well-known techniques and structures have not been described in detail in order not to unnecessarily obscure the present invention.

Referring to FIG. 1, an embodiment of the present invention is shown. A transformer 1 is comprised of a molded bridge 3, a spacer 4 and a core 2. The core 2 is shaped to form a closed loop for the flux lines. The shape of the core shown is a square with an opening disposed throughout the center of the square. The actual shape of the core 2 of the present invention is not material to the practice of the present invention, and as will be evident later, the core 2 can be one of various shapes, such shapes being rectangular or toroidal. The core 2 can be constructed of various magnetic materials, however, the preferred material is still the use of a ferrous material.

Also referring to FIG. 2, the spacer 4 is initially placed upon the surface of a PC board (not shown). Using the example shown in FIG. 1, both spacers 4 would be placed onto the PC board. Once the spacers 4 are positioned, the ferrite core 2 is placed atop the spacers 4. The spacer 4 is comprised of a body 10 formed from a dielectric material and having 6 extending from the dielectric body 10. The leads 6 is designed to mate to the surface of the PC board, or in the alternative, is inserted through openings in the PC board. The spacer 4 of the preferred embodiment, has a width dimension of at least the width w of core 2.

Then, after the placement of core 2 onto spacers 4, each bridge 3 is placed to overlie core 2 and its spacer 4. The bridge 3 of the preferred embodiment is U-shaped to substantially surround the exposed portions of core 2 overlying spacer 4. That is, the opposing sides of the U-shaped bridge 3 has a dimension substantially close to the height dimension h of core 2 and the connecting portion of the bridge has a dimension sufficient to encompass the width w of core 2. As shown in the drawings of FIGS. 1 and 2, the spacer 4 is substantially flat where upon the core 2 resides on its substantially flat surface and where the bridge 3 forms the other three sides of an open-ended rectangular sleeve around core 2. Because of the placement of core 2 onto spacer 4, the core 2 is insulated from the mounting surface of the PC board. The core 2 of the preferred embodiment is made from ferrite material.

The bridge 3 is comprised of a molded body of dielectric material, equivalent to that of spacer 4 and has a plurality of leads 5 extending from the opposing sides of the U-shaped bridge. The leads 5 of bridge 3 is mated to the surface of the PC board, or alternatively inserted through openings in the PC board. The preferred embodiment has leads 5 and 6 which mate to the surface of the PC board. In the preferred embodiment, leads 5 are shaped and spaced to lie upon leads 6. As shown in FIG. 1, two spacer 4 and bridge 3 assemblies are shown disposed on opposite sides of the four-sided core 2. In the simplest embodiment, one assembly 17 represents a primary winding while the other assembly 18 represents the secondary winding. The flux coupling between the primary 17 and secondary 18 is achieved through core 2 for the most part, although coupling through the air can also occur.

Referring to FIG. 4, a cut away view of the spacer 4 of the present invention is shown in more detail. The spacer 4 is configured to have a plurality of leads disposed opposite of each other similar to a dual inline package (DIP) configuration. Conductors 9 are disposed across the width of the spacer 4 interconnecting corresponding leads 16a and 16b, disposed on opposite sides of spacer 4. The plurality of conductors 9 positioned within the body 10 of spacer 4 functionally operate as a portion of windings of transformer 1.

Referring to FIG. 8, the bridge member 3 is more fully illustrated in a cut-away view showing the plurality of conductors 7 within a body 8 of bridge member 3. Conductors 7 are disposed within the body 8 interconnecting corresponding opposite terminals 19a and 19b. The bridge 3 is fabricated to represent a three sided rectangular member and the conductors 7 are formed within the body and the extremities of the conductor 7 extend past the body 8 to form the terminals 5.

As shown in FIG. 2, when bridge 3 is disposed over core 2 to mate with spacer 4, terminals 5 of bridge 3 mate with corresponding terminals 6 of spacer 4. As noted in FIG. 4, the conductors and the spacer coupled leads 6 have an offset of one position as shown by the connection of terminal 16 a and 16b in FIG. 4. When the bridge 3 is placed to mate with spacer 4, the terminal 6 offset operates to couple one terminal of lead 5 to the opposite terminal of the subsequent conductor of bridge 3. That is conductor 9 of spacer 4 causes terminal 19b to be coupled to terminal 19c. This offsetting operates to functionally provide a continuous conductor loop which is equivalent to a spiral winding of a transformer. When bridge 3 of FIG. 8 is placed upon spacer 4 of FIG. 4, one continuous winding is provided from terminal 19a to terminal 19d which performs the function of a winding of a transformer.

Referring to FIG. 3, a cross-sectional diagram of one of the winding segments 17 or 18 of FIG. 1 is shown. In this diagram, spacer 4 is shown residing on a PC board 11, the core 2 overlying the spacer 4, and the bridge 3 overlying the section of core 2. As described earlier, lead 5 abuts to lead 6 such that when leads 5 and 6 are permanently affixed, such as by soldering, not only is there complete electrical coupling provided, but bridge 3 and spacer 4 are permanently affixed to the PC board 11. Because bridge 3 is designed to fit snugly over core 2, core 2 is held in position when bridge 3 is permanently affixed to the PC board 11.

In the cross-sectional view of FIG. 3, a cut away view of conductors 7 and 9 are shown residing within the body 8 and 10, respectively. The dielectric material of the bodies 8 and 10 of the preferred embodiment is comprised of ceramic or plastic, however, other dielectric materials can be used. Typically molded plastic is utilized for bodies 8 and 10. Because conductors 7 and 9 are singular conductors and also because they reside within hardened bodies 8 and 10, precise control of the placement of conductors 7 and 9 is achieved. As shown, in the preferred embodiment, conductors 7 and 10 are disposed centrally within bodies 8 and 10, respectively. This precise control of the placement of the conductors 7 and 9 permits these conductors 7 and 9 to be placed at a uniform distance from core 2. It is to be appreciated that although a particular lead shape is shown for leads 5 and 6, other lead configurations can be readily used without departing from the spirit and scope of the present invention. Also, as stated earlier, the leads can be inserted through openings in PC board 11 and is not limited to having the leads affixed on one surface of the PC board 11. Conductors 7 and 9 can be of any prior art material used for conducting current.

The construction of one transformer winding as shown in FIGS. 2, 3, 4 and 8 are duplicated to provide segments 17 and 18 of FIG. 1. One of these segments functions as the primary winding and the other operates as the secondary winding of the transformer. For example, if winding 17 is the primary winding, then winding 18 will be the secondary winding. As noted in the transformer equation, the number of conductors in each of the windings of 17 or 18 will depend on the number of windings required for a given transformer design.

Because of the design of the transformer of the present invention, the transformer 1 of the present invention is readily usable with SMT. For automated assembly of transformer 1 onto a PC board, the robotics mechanism, such as a robotics arm, places spacers 4 onto a PC board. Next, the robotics mechanism will place core 2 onto spacers 4 and finally bridges 3 are placed to overly spacer 4 and core 2. In the alternative, the complete transformer 1 can be assembled and the completed assembled transformer is placed onto the PC board 11 and permanently affixed to the PC board, such as by soldering. Because the transformer 1 requires no manual winding of the winding coils, as well as having a particular configuration, it is readily acceptable for use in SMT, permitting high reliability and a lower assembly cost.

Further, high efficiency is achieved with the transformer of the present invention because higher flux linkage can be achieved while dissipating less heat for a given size transformer. As noted in FIG. 1, a significant surface area of core 2 is exposed to the ambient so that heat dissipation can take place from the exposed surface of core 2. Additionally, because the actual physical coupling of the primary and secondary windings are separated by a finite distance, leakage inductance is utilized to provide the flux coupling between the windings. In the transformer 1 of FIG. 1, the leakage inductance coupling will necessarily need to couple the flux between the primary and secondary windings. Besides the physical distance separating the two windings by their physical separation upon core 2, the physical disposition of the conductors 7 and 9, as well as the material comprising the dielectric bodies 8 and 10, provide for precise control of the leakage inductance by controlling these various parameters. That is, coupling efficiency can be controlled by calculating the various parameters comprising bridge 3, spacer 4 and core 2 of transformer 1. Such closely monitored parametric control is achievable mainly due to the fact that the transformer windings do not need to be wound as is done in the prior art.

Referring to FIG. 6, a top plan view of the PC board 11, having transformer 1 mounted by the use of SMT is shown. Transformer 1 of FIG. 1 is designated as transformer A on PC board 11. A second transformer designated B is also disposed on PC board 11. Transformer B is another surface mount transformer of the present invention and is equivalent to transformer A, except that two additional windings are also present. The multiple windings are configured equivalently to various prior art techniques for using multiple windings. Although various winding connections can be utilized in multiple winding transformers, for illustrative purpose only, transformer B is shown having two primary windings 17b and two secondary windings 18b. The actual location of the various windings is a design choice. Transformer B has a winding at each side of the rectangular shaped core.

Another example of the transformer of the present invention is shown in transformer C. Transformer C is equivalent to that of transformer A, however, the physical size of the transformer is much smaller. Transformer C is shown as an example of practicing the present invention wherein the physical size of the various parameters can be changed to reflect a given design choice. For example, transformer A can be designed for a 250 watt operation. In this instance, core 2 of transformer A is 1.25 inches square at the outer edges with a 0.75 inch square center opening, as well as having a 0.25 inch width and a 0.25 inch heighth. The bridge 3 is 0.5 inches wide by 0.38 inches high by 0.55 inches long externally with a 0.12 wall thickness. The bridge 3 conductors are 30 mils (thousandth of an inch) wide with 50 mils distance between the leads. The spacer 4 is 0.25 inches wide by 0.12 inches high by 0.55 inches long with conductors at 30 mils wide and 50 mils separating the leads.

However, transformer C being of a smaller size is designed to operate at a lower wattage. Transformer C is a 30 watt transformer having a core of 0.5 inch square at the outer edge with a 0.30 inch square opening and having a 0.10 inch width and a 0.175 inch heighth. The bridge is 2.5 inches wide by 0.17 inches high by 0.30 inches long externally with a 0.62 wall thickness. The bridge member conductors are 50 mils wide with 25 mils between the leads. The spacer 4 is 0.12 inches wide by 0.062 inches high by 0.30 inches long with conductors at 50 mils wide and 25 mil spacing separating the leads. As exemplified by the various parameter differences, transformers can be designed for a given design specification and the construction of the transformer of the present invention is readily adaptive to such design variations. It is to be appreciated that the dimensions given above are provided for illustrative purpose only and is not for the purpose of limiting the present invention.

Referring to FIG. 7, an alternative embodiment of a transformer of the present invention is shown. This alternative embodiment depicts an alternative shape. Transformer 41 is equivalent to that of transformer 1 of FIG. 1, however, toroidal core 42 is used instead of the rectangular shape core 2 of FIG. 1. In order to compensate for the toroidal shape of core 42, bridge 43 and spacer 44 are radially shaped to conform to the toroidal shape of core 42. Because of the shape, conductor placement within bridge 43 and spacer 44 must also conform to the shape of transformer 41. However all other specifications that apply to a substantially rectangular embodiment of the present invention are present in the alternative embodiment of transformer 41.

Referring to FIG. 9, a second alternative embodiment of the present invention is shown. In FIG. 9, a concentric mounting arrangement of two rectangular shaped transformer windings is shown. In this embodiment, a first bridge 23 is located onto PC board 26 and encloses core 20 by the technique described above. Bridge 23 is equivalent to a bridge of one of the windings 17 or 18 shown in FIG. 1, however, in this instance, instead of using spacer 4 the lower conductor (conductor 9 of FIG. 4) is obtained as part of tracings 22 of a PC board 26. Conductors 25 of bridge 23 mates with conductor tracings 22 to form a physical and electrical bonding, equivalent to that disclosed in FIG. 1. That is, spacer 4 is now actually incorporated as part of the PC board 26. To insulate the core 20 from the upper tracing 22, a dielectric insulator 29 is disposed onto the PC board 26 to overlie tracings 22. Insulator 29 can be part of the PC board 26 or it can be placed separately.

Then a second bridge 24 is placed atop bridge 23 to enclose the first bridge 23. The conductors 35 of bridge 24 pass through openings of the PC board 26 to couple to tracings 32, which are disposed on the opposite of the PC board from tracings 22. As can be seen in the cross-sectioned diagram of FIG. 9, the first bridge 23 encompasses core 20 and second bridge 24 is arranged concentrically over the first bridge 23, as well as core 20. This design provides for one of the conductors to be used as the primary winding while the other is utilized as the secondary winding. The design of having two windings overlying approximately the same area of core 20 is closer in design to that of prior art transformers using iron cores. An advantage of using the alternative embodiment of FIG. 9 is to provide for a precise control of various parameters which determine the leakage inductance between the primary and secondary windings. By carefully controlling the parameters, such as conductor size, spacial separation of the two sets of conductors, the material of the dielectric separating the two windings, as well as various other parameters, leakage inductance from the primary to the secondary windings can be controlled precisely. If the design of FIG. 9 is used in place of transformer 1, then it is analogous to having winding 18 being disposed above winding 17. That is, bridge and spacer sections of segment 18 would be disposed to encompass bridge and spacer segments of segment 17. Alternatively, an additional number of windings can be disposed about a core, which shape can also be varied to meet various design requirements.

Further the technique of incorporating the spacer conductor as part of a PC board can be also achieved with the earlier described transformer 1. Such an example is shown in FIG. 5, wherein tracings 12 on the opposite side of the PC board 11a is used instead of spacer 4.

Referring to FIG. 10, another alternative embodiment of the present invention is shown. The transformer of this embodiment is comprised of bridge/conductor members forming windings 23a and 24a and both encompassing core 20a equivalently to the embodiment shown in FIG. 9. However, the transformer of FIG. 10 is utilized for high voltage applications where insulation breakdown is a paramount concern. For example, one safety requirement necessitates a minimum physical distance separating the windings, as well as the windings from the core. For example, a spacing of one millimeter through an insulator or four millimeters through air is needed for one safety requirement. The alternative embodiment of FIG. 10 provides for meeting such requirements.

The outer winding 24a is disposed within its bridge housing and mates with traces 32a which are on the opposite side of the PC board 26a. Because the dielectric housing of the bridge portion of winding 24a extends at least to the surface of PC board 26a, winding 24a will have a dielectric separation of at least one millimeter from the inner conductor 23a. However, the inner winding 23a can present a problem because it is coupled to the upper portion of the PC board 26a. Further, because winding 23a mates with the upper tracing 22a of PC boards 26a, an air gap 27 will occur at this juncture. Further, because the two bridge members of windings 24a and 23a may not fit snugly, air gaps 28 may exist. Further, because a dielectric support member 29a will be needed to insulate the core at least one millimeter above the upper tracing 22a, an air gap may occur at the joining of support member 29a to the bridge portion of winding 23a. The separation requirement between the winding 23a and core 20a can be met by having a dielectric separation of at least one millimeter. In the event an air gap exists between core 20a and the exposed portion of conductor 23a, such as at air gap 24, the four millimeter air gap requirement can be met by simply extending the lateral sides of base member 29a upward while directing the bridge member of winding 23a downward so that at least 4 millimeters of air gap spacing occurs between core 28 and exposed portion of conductor 23a. This air gap spacing is shown in FIG. 10 by dots 30. Thus, an alternative embodiment shown in FIG. 10 depicts how various design parameters can be configured to provide a transformer to meet specific design and safety requirements, such as for high voltage applications. It is to be appreciated that the assembly of the transformer of FIG. 10 commences with the inner area and is assembled outward toward winding 24a.

A further alternative embodiment of the present invention is shown in FIG. 11. FIG. 11 shows a rectangular shaped core 50, but having a center member 51. Although the earlier described configurations can be used to assemble a transformer upon core 50, another alternative embodiment is shown in FIG. 12. Core 50 is placed upon an insulating support member 55 to provide a foundation for mounting core 50 onto a PC board 56. In this embodiment, the inner winding 57 mates with tracings 60 which is disposed at the opposite surface of PC board 56. Alternatively, the outer winding 58 mates to the tracings 59 on the upper surface of PC board 56.

A slightly modified design of the concentric surface mounted transformer of FIG. 12 is shown in FIG. 13. In this embodiment, a third winding 59 is placed atop winding 58 and coupling is made to the tracings 60 on the opposite side of the PC board 56. In this instance all windings are substantially isolated from core 50. In this example winding 58 is the primary winding and windings 57 and 59 would function to operate as secondary windings. It is to be appreciated that the various earlier described techniques and embodiments can be readily adapted to the examples of FIGS. 12 and 13.

Although a number of embodiments have been described, it is to be appreciated that these embodiments are provided for illustrative purpose only and is not for the purpose of limiting the invention. In accordance with these principles numerous modifications and alternatives may be devised without departing from the spirit and scope of the present invention. The practice of the present invention permits the surface mounting of transformers, especially when utilized with automated assembly mechanisms. The economic advantages derived results from not needing to physically wind the transformer windings and from reduced labor costs due to automated assembly. Additionally, the design flexibility permits numerous design modifications to be achieved to meet various design and safety requirements. Further, the physical parameters of the transformer can be tightly controlled for precise and accurate design constraints, such as the control of leakage inductance by controlling the geometry of the size, shape and material of the transformer components. Also, the present invention improves heat dissipation from the transformer due to the exposure of a significant surface of the core of the transformer.

Thus, a transformer for use with surface mounting technology is described.

I claim:

1. A small size, light weighted surface mount transformer assembly used in surface mount technology comprising a surface mountable transformer winding including:
   a spacer member having a plurality of conductors disposed therein;
   a magnetic core disposed onto said spacer member;
   said spacer member comprising a substantially flat housing having a width dimension of at least the width of said magnetic core;
   a bridge member having a U-shaped housing portion having a plurality of conductors disposed therein;
   said U-shaped housing portion having opposing sides, having a height dimension of said magnetic core and a connecting portion having a dimension to encompass the width of said magnetic core;
   said bridge member being disposed onto said magnetic core to substantially overlie said spacer member and substantially enclose exposed portions of said magnetic core overlying said spacer member;
   said conductors of said spacer member being coupled to said conductors of said bridge member, such as to form a continuous loop around said magnetic core to form said transformer winding.
   magnetic core to form said transformer winding.

2. The transformer winding of claim 1, wherein said conductors of said spacer member are disposed in a dielectric spacer housing.

3. The transformer winding of claim 2, wherein said conductors of said bridge member are disposed in a dielectric bridge housing.

4. The transformer winding of claim 3, wherein said conductors of said bridge member are arranged in parallel and wherein opposite ends of each of said bridge conductors extend out of said dielectric bridge housing.

5. The transformer winding of claim 4, wherein said conductors of said spacer member are arranged in parallel and wherein opposite ends of each of said spacer conductors extend out of said dielectric spacer housing.

6. The tranformer winding of claim 5, wherein said magnetic core is made from a ferromagnetic material.

7. The transformer winding of claim 6, wherein said core is rectangular in shape.

* * * * *